(12) United States Patent
Takenaka et al.

(10) Patent No.: US 8,853,734 B2
(45) Date of Patent: Oct. 7, 2014

(54) CURABLE EPOXY RESIN COMPOSITION

(75) Inventors: Hiroto Takenaka, Ohtake (JP); Atsuo Tatsumi, Ohtake (JP)

(73) Assignee: Daicel Corporation, Osaka-Shi (JP)

( * ) Notice: Subject to any disclaimer, the term of this patent is extended or adjusted under 35 U.S.C. 154(b) by 192 days.

(21) Appl. No.: 13/510,521

(22) PCT Filed: Jan. 21, 2011

(86) PCT No.: PCT/JP2011/051073
§ 371 (c)(1),
(2), (4) Date: Jun. 20, 2012

(87) PCT Pub. No.: WO2011/093219
PCT Pub. Date: Aug. 4, 2011

(65) Prior Publication Data
US 2012/0248498 A1 Oct. 4, 2012

(30) Foreign Application Priority Data

Feb. 1, 2010 (JP) ................................. 2010-019927

(51) Int. Cl.
*C08L 63/00* (2006.01)
*H01L 23/29* (2006.01)
*C08G 59/22* (2006.01)
*C08G 59/26* (2006.01)
*H01L 33/56* (2010.01)

(52) U.S. Cl.
CPC ............... *H01L 23/293* (2013.01); *H01L 33/56* (2013.01); *C08G 59/226* (2013.01); *C08G 59/26* (2013.01); *C08L 63/00* (2013.01)
USPC .................... 257/100; 257/E33.059; 525/526

(58) Field of Classification Search
None
See application file for complete search history.

(56) References Cited

U.S. PATENT DOCUMENTS

| 2003/0059618 | A1 | 3/2003 | Takai |
| 2006/0204760 | A1 | 9/2006 | Ito |
| 2006/0204761 | A1 | 9/2006 | Ito |
| 2007/0265427 | A1* | 11/2007 | Takai et al. .................. 528/405 |
| 2011/0319589 | A1 | 12/2011 | Takeyama et al. |

FOREIGN PATENT DOCUMENTS

| EP | 1 389 615 | A1 | | 2/2004 |
| EP | 2 397 507 | A1 | | 12/2011 |
| JP | 07-309927 | A | | 11/1995 |
| JP | 2000-344867 | A | | 12/2000 |
| JP | 2000-344867 | A | * | 12/2000 |
| JP | 2002-003582 | A | | 1/2002 |
| JP | 2002-338659 | A | | 11/2002 |
| JP | 2003-292568 | A | | 10/2003 |
| JP | 2004-027001 | A | | 1/2004 |
| JP | 2004-217780 | A | | 8/2004 |
| JP | 2004-217780 | A | * | 8/2004 |
| JP | 2005-171187 | A | | 6/2005 |
| JP | 2006-241230 | A | | 9/2006 |
| JP | 2006-274249 | A | | 10/2006 |
| WO | WO 2010/092947 | A1 | | 8/2010 |

OTHER PUBLICATIONS

HCAPLUS accession No. 1970:446272 for Japanese Patent No. 45-5906 B, Muramoto, Feb. 27, 1970, three pages.*
International Search Report for PCT/JP2011/051073 dated Mar. 1, 2011.

* cited by examiner

*Primary Examiner* — Robert Sellers
(74) *Attorney, Agent, or Firm* — Birch, Stewart, Kolasch & Birch, LLP

(57) ABSTRACT

Provided are: a curable epoxy resin composition including an alicyclic epoxy compound (A), a monoallyl diglycidyl isocyanurate compound (B) represented by following Formula (1) where each of $R_1$s and $R_2$ represents a hydrogen atom or an alkyl group having 1 to 8 carbon atoms, and a curing agent (C) or curing catalyst (D); and a cured article obtained through curing of the curable epoxy resin composition. The alicyclic epoxy compound (A) preferably has cyclohexene oxide group as the alicyclic epoxy group.

[Chem. 1]

(1)

18 Claims, 1 Drawing Sheet

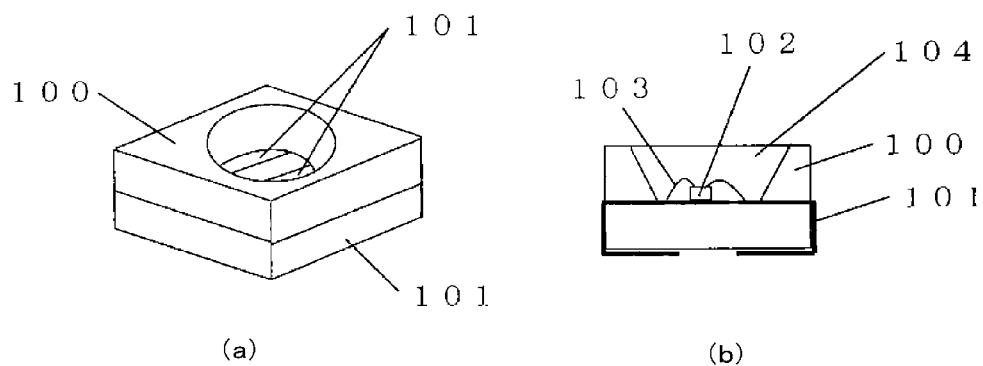

CURABLE EPOXY RESIN COMPOSITION

TECHNICAL FIELD

The present invention relates to: a curable epoxy resin composition; a cured article obtained through curing of the curable epoxy resin composition; an optical-semiconductor-sealing resin composition including the curable epoxy resin composition; and an optical semiconductor device including an optical semiconductor element sealed with the curable epoxy resin composition. The curable epoxy resin composition according to the present invention is usable typically as or in optical semiconductor sealants, adhesives, electrical insulating materials, laminated plates, coatings, inks, paints (coating materials), sealants, resists, composite materials, transparent substrates, transparent sheets, transparent films, optical elements, optical lenses, optical members or materials, stereo lithography, electronic papers, touch panels, solar cell substrates, optical waveguides, light guide panels, and holographic memories.

BACKGROUND ART

Recent optical semiconductor devices have higher and higher output powers, and resins for use in the optical semiconductor devices should have satisfactory thermal stability. Typically, sealants for blue/white light emitting optical semiconductors suffer from yellowing of resins caused by light and heat emitted from an optical semiconductor element. Such a sealing resin, when yellowed, absorbs light emitted from the optical semiconductor element, and this reduces the luminous intensity of light emitted from the device.

As a possible solution to improvements in thermal stability, there has been known a technique of using a composition including a monoallyl diglycidyl isocyanurate and a bisphenol-A epoxy resin (Patent Literature (PTL) 1). However, if this material is used as a sealant for a high-output blue/white light emitting optical semiconductor device, coloring of the resin proceeds by the action of light and heat emitted from the optical semiconductor element, and the colored resin absorbs light to be outputted, resulting in decreasing luminous intensity of the device with time.

CITATION LIST

Patent Literature

PTL 1: Japanese Unexamined Patent Application Publication (JP-A) No. 2000-344867

SUMMARY OF INVENTION

Technical Problem

Accordingly, an object of the present invention is to provide a curable epoxy resin composition which can give a cured article exhibiting satisfactory thermal stability, light fastness, optical transparency, and cracking resistance and can thereby give a resin suitable typically as a sealant for high-output blue/white light emitting optical semiconductor devices.

Another object of the present invention is to provide a cured article which is cured from the curable epoxy resin composition and has satisfactory thermal stability, light fastness, optical transparency, and cracking resistance.

Yet another object of the present invention is to provide an optical-semiconductor-sealing resin composition which includes the curable epoxy resin composition and exhibits satisfactory thermal stability, light fastness, optical transparency, and cracking resistance.

Still another object of the present invention is to provide an optical semiconductor device which includes an optical semiconductor sealed by the use of the curable epoxy resin composition and has satisfactory thermal stability, light fastness, optical transparency, and cracking resistance.

Solution to Problem

After intensive investigations to achieve the objects, the present inventors found that a curable epoxy resin composition including an alicyclic epoxy compound having a specific structure, a monoallyl diglycidyl isocyanurate, and a curing agent gives a cured article excellent in thermal stability, light fastness, and optical transparency; and that the composition, when used as a curable epoxy resin composition, can give an optical semiconductor device which has satisfactory thermal stability, light fastness, optical transparency, and cracking resistance. The present invention has been made based on these findings.

Specifically, the present invention provides, in an aspect, a curable epoxy resin composition which includes an alicyclic epoxy compound (A); a monoallyl diglycidyl isocyanurate compound (B) represented by following Formula (1):

[Chem. 1]

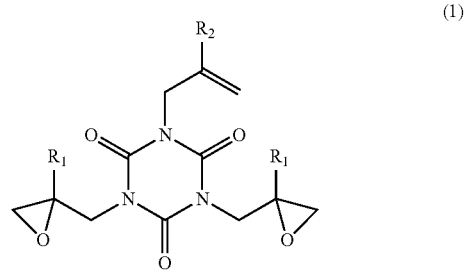

(1)

wherein each of $R_1$s and $R_2$ independently represents a hydrogen atom or an alkyl group having 1 to 8 carbon atoms; and one of a curing agent (C) and a curing catalyst (D).

In a preferred embodiment, the alicyclic epoxy compound (A) has cyclohexene oxide group as an alicyclic epoxy group thereof.

In another preferred embodiment, the alicyclic epoxy compound (A) is a compound represented by following Formula (I-1):

[Chem. 2]

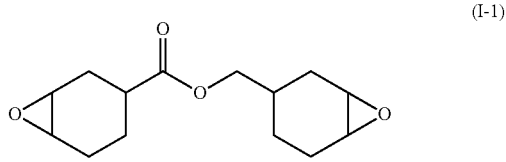

(I-1)

The curable epoxy resin composition according to the present invention may further include a curing accelerator (E).

In another aspect, the present invention provides a cured article obtained through curing of the curable epoxy resin composition.

The present invention provides, in still another aspect, an optical-semiconductor-sealing resin composition including the curable epoxy resin composition.

In addition and advantageously, the present invention provides an optical semiconductor device including an optical semiconductor element sealed with the curable epoxy resin composition.

Advantageous Effects of Invention

The curable epoxy resin composition according to the present invention can give a cured article excellent in thermal stability, light fastness, optical transparency, and cracking resistance and can give a semiconductor device which has an element sealed with the cured article and excels in thermal stability, light fastness, optical transparency, and cracking resistance. The cured article and optical semiconductor device according to the present invention excel in thermal stability, light fastness, optical transparency, and cracking resistance.

BRIEF DESCRIPTION OF DRAWINGS

FIG. 1 depicts schematic diagrams illustrating one embodiment of an optical semiconductor device including an element sealed with the curable epoxy resin composition according to the present invention, in which the left view (a) is a perspective view, and the right view (b) is a cross-sectional view.

DESCRIPTION OF EMBODIMENTS

<Curable Epoxy Resin Composition>

A curable epoxy resin composition according to an embodiment of the present invention includes an alicyclic epoxy compound (A); a monoallyl diglycidyl isocyanurate compound (B) represented by following Formula (1):

[Chem. 3]

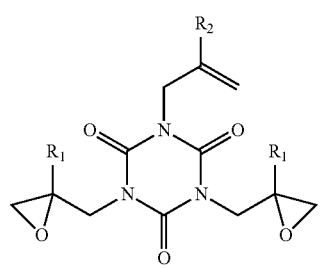

(1)

wherein each of $R_1$s and $R_2$ independently represents a hydrogen atom or an alkyl group having 1 to 8 carbon atoms; and one of a curing agent (C) and a curing catalyst (D). Where necessary, the curable epoxy resin composition according to the present invention may further include a curing accelerator (E).

<Alicyclic Epoxy Compound (A)>

Exemplary alicyclic epoxy compounds (A) for use in the present invention include (i) compounds each having at least one epoxy group composed of oxygen atom and adjacent two carbon atoms constituting an aliphatic ring (alicycle); and (ii) compounds each having an epoxy group directly bonded to an aliphatic ring through a single bond.

The compounds (i) each having at least one epoxy group (alicyclic epoxy group) composed of oxygen atom and adjacent two carbon atoms constituting an aliphatic ring for use herein can be freely selected from among known customary ones. The alicyclic epoxy group is preferably cyclohexene oxide group.

Of compounds (i) each having at least one epoxy group (alicyclic epoxy group) composed of oxygen atom and adjacent two carbon atoms constituting an aliphatic ring, particularly preferred from the viewpoints of optical transparency and thermal stability are alicyclic epoxy resins represented by following Formula (I):

[Chem. 4]

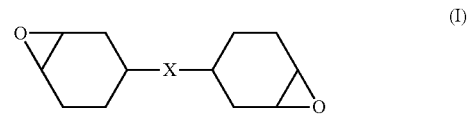

(I)

In Formula (I), X represents a linkage group (divalent group having one or more atoms), which is exemplified by divalent hydrocarbon groups, carbonyl group, ether bond, ester bond, carbonate group, amide group, and groups each composed of two or more of these linked to each other.

Exemplary divalent hydrocarbon groups include linear or branched chain alkylene groups each having 1 to 18 carbon atoms; and divalent alicyclic hydrocarbon groups. Exemplary linear or branched chain alkylene groups each having 1 to 18 carbon atoms include methylene, methylmethylene, dimethylmethylene, ethylene, propylene, and trimethylene groups. Exemplary divalent alicyclic hydrocarbon groups include divalent cycloalkylene groups (inclusive of cycloalkylidene groups), such as 1,2-cyclopentylene, 1,3-cyclopentylene, cyclopentylidene, 1,2-cyclohexylene, 1,3-cyclohexylene, 1,4-cyclohexylene, and cyclohexylidene groups.

The linkage group X is preferably an oxygen-containing linkage group, which is exemplified by —CO—, —O—CO—O—, —COO—, —O—, —CONH—; a group composed of two or more of these linked to each other; and a group composed of one or more of these groups linked to one or more divalent hydrocarbon groups. Examples of the divalent hydrocarbon groups herein are as mentioned above.

Typical examples of alicyclic epoxy compounds represented by Formula (I) include compounds represented by following Formulae (I-1), (I-2), (I-3), (I-4), (I-5), (I-6), (I-7), and (I-8), which are typified by commercial products such as CELLOXIDE 2021P and CELLOXIDE 2081 each supplied by Daicel Corporation. In the following formulae, "l" and "m" each denote an integer of 1 to 30; and R represents an alkylene group having 1 to 8 carbon atoms, which is typified by linear or branched chain alkylene groups such as methylene, ethylene, propylene, isopropylene, butylene, isobutylene, s-butylene, pentylene, hexylene, heptylene, and octylene groups. Among them, preferred are linear or branched chain alkylene groups each having 1 to 3 carbon atoms, such as methylene, ethylene, propylene, and isopropylene groups.

[Chem. 5]

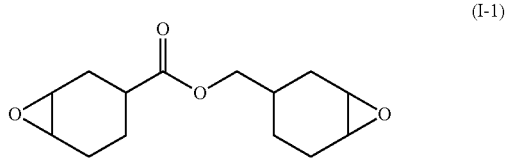

(I-1)

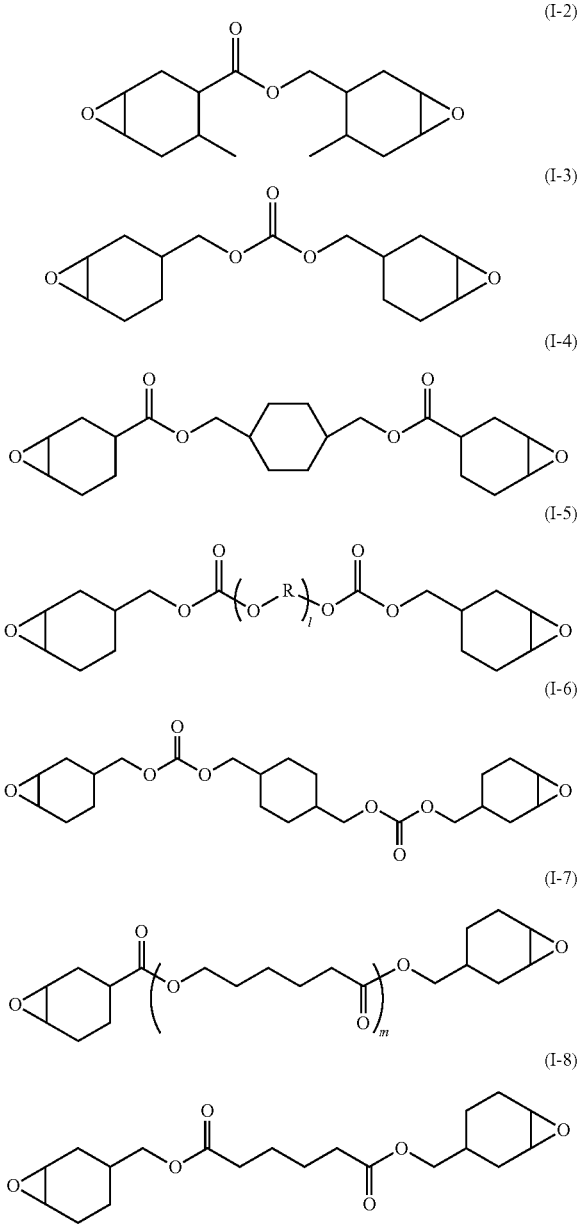

Examples of the compounds (ii) each having at least one epoxy group directly bonded to an aliphatic ring through a single bond include compounds represented by following Formula (II):

[Chem. 6]

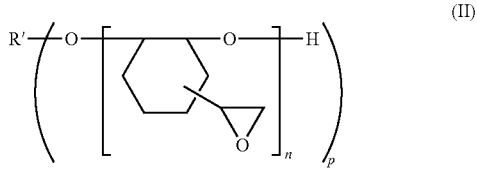

wherein R' represents a group corresponding to a "p"-hydric alcohol (alcohol having hydroxyl group(s) in a number of "p"), except for removing p-OHs (—OH group(s) in a number of p) removed therefrom; and "p" and "n" independently represent natural numbers. Exemplary "p"-hydric alcohols [R'—(OH)$_p$] include polyhydric alcohols such as 2,2-bis(hydroxymethyl)-1-butanol, of which alcohols each having 1 to 15 carbon atoms are preferred. The number "p" is preferably from 1 to 6; and the number "n" is preferably from 1 to 30. When "p" is 2 or more, the numbers "n"s in the respective groups in the parentheses may be the same as or different from each other. The compounds are typified by an adduct of 2,2-bis(hydroxymethyl)-1-butanol with 1,2-epoxy-4-(2-oxiranyl)cyclohexane or EHPE 3150 (supplied by Daicel Corporation).

Each of such alicyclic epoxy compounds (A) may be used alone or in combination, and commercial products such as CELLOXIDE 2021P, CELLOXIDE 2081, and EHPE 3150 (each supplied by Daicel Corporation) may be used. Of alicyclic epoxy compounds (A), 3,4-epoxycyclohexylmethyl 3',4'-epoxycyclohexanecarboxylate represented by Formula (I-1) or CELLOXIDE 2021P is particularly preferred.

The alicyclic epoxy compound(s) (A) is used in an amount of typically from 50 to 90 parts by weight, preferably from 60 to 90 parts by weight, and more preferably from 70 to 90 parts by weight, per 100 parts by weight of the total amount of the alicyclic epoxy compound(s) (A) and the monoallyl diglycidyl isocyanurate compound(s) (B). If the alicyclic epoxy compound(s) (A) is used in an amount of less than 50 parts by weight, the monoallyl diglycidyl isocyanurate compound(s) (B) may not sufficiently be dissolved and may tend to precipitate when the composition is placed at room temperature. The alicyclic epoxy compound(s) (A), if used in an amount of more than 90 parts by weight, may cause cracking when a semiconductor device is fabricated using the composition. The total amount of the alicyclic epoxy compound(s) (A) and the monoallyl diglycidyl isocyanurate compound(s) (B) in the curable epoxy resin composition is preferably from 30 to 99.9 percent by weight.

<Monoallyl Diglycidyl Isocyanurate Compound (B)>

The monoallyl diglycidyl isocyanurate compound (B) for use in the present invention is represented by following General Formula (1):

[Chem. 7]

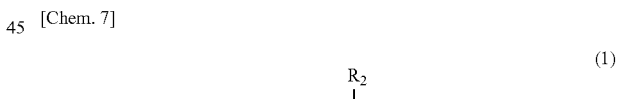

wherein each of $R_1$s and $R_2$ independently represents a hydrogen atom or an alkyl group having 1 to 8 carbon atoms.

Examples of the alkyl group having 1 to 8 carbon atoms include linear or branched chain alkyl groups such as methyl, ethyl, propyl, isopropyl, butyl, isobutyl, s-butyl, pentyl, hexyl, heptyl, and octyl groups. Among them, preferred are linear or branched chain alkyl groups each having 1 to 3 carbon atoms, such as methyl, ethyl, propyl, and isopropyl groups. $R_1$s and $R_2$ are particularly preferably hydrogen atoms.

The monoallyl diglycidyl isocyanurate compound (B) may be typified by monoallyl diglycidyl isocyanurate, 1-allyl-3,5-(2-methylepoxypropyl)isocyanurate, 1-(2-methylpropenyl)-3,5-diglycidyl isocyanurate, and 1-(2-methylpropenyl)-3,5-(2-methylepoxypropyl)isocyanurate.

The monoallyl diglycidyl isocyanurate compound(s) (B) may be used within such a range as to be dissolved in the alicyclic epoxy compound(s) (A). The ratio (by weight) of the alicyclic epoxy compound(s) (A) to the monoallyl diglycidyl isocyanurate compound(s) (B) is preferably from 50:50 to 90:10. If the ratio is out of the above-specified range, satisfactory solubility may be less obtained.

The monoallyl diglycidyl isocyanurate compound(s) (B) may have undergone modification with a compound (e.g., an alcohol or acid anhydride) that is reactive with epoxy group.

The total amount of the alicyclic epoxy compound(s) (A) and the monoallyl diglycidyl isocyanurate compound(s) (B) is preferably 80 percent by weight or more and particularly preferably 90 percent by weight or more, relative to the total amount of epoxy resins (epoxy-containing compounds).

<Curing Agent (C)>

The curing agent (C) has the function of curing epoxy-containing compounds. The curing agent (C) for use in the present invention may be any of curing agents known or customarily used as epoxy resin curing agents. Among them, the curing agent (C) is preferably an acid anhydride that is liquid at 25° C., which is typified by methyltetrahydrophthalic anhydride, methylhexahydrophthalic anhydride, dodecenylsuccinic anhydride, and methyl-endomethylene tetrahydrophthalic anhydride. An acid anhydride that is solid at room temperature (about 25° C.) may be used as the curing agent (C) in the present invention by dissolving in an acid anhydride that is liquid at room temperature (about 25° C.) to give a liquid mixture. Exemplary acid anhydrides that are solid at room temperature include phthalic anhydride, tetrahydrophthalic anhydride, hexahydrophthalic anhydride, and methylcyclohexenedicarboxylic anhydride.

The curing agent (C) for use herein may also be a commercial product such as Rikacid MH-700 (supplied by New Japan Chemical Co., Ltd.) or HN-5500 (supplied by Hitachi Chemical Co., Ltd.).

The curing agent (C) is used in an amount of typically from 50 to 200 parts by weight, and preferably from 100 to 145 parts by weight, per 100 parts by weight of the total amount of epoxy-containing compounds contained in the curable epoxy resin composition. More specifically, the curing agent (C) is preferably used in an amount of 0.5 to 1.5 equivalents per 1 equivalent of epoxy group in total epoxy-containing compounds contained in the curable epoxy resin composition. The curing agent (C), if used in an amount of less than 50 parts by weight, may exhibit insufficient effects and may cause the cured article (C) to have insufficient toughness. In contrast, the curing agent (C), if used in an amount of more than 200 parts by weight may cause the cured article to be colored and to have deteriorated hue.

<Curing Catalyst (D)>

The composition according to the present invention may employ, as the curing catalyst (D), a cationic catalyst which generates a cationic species through ultraviolet irradiation or a heating treatment to thereby initiate polymerization.

Exemplary cationic catalysts which generate cationic species through ultraviolet irradiation include hexafluoroantimonate salts, pentafluorohydroxyantimonate salts, hexafluorophosphate salts, and hexafluoroarsenate salts, and preferred examples thereof are commercial products such as UVACURE 1590 (supplied by Daicel-Cytec Co., Ltd.); CD-1010, CD-1011 and CD-1012 (each supplied by Sartomer Company Inc., U.S.A.), IRGACURE 264 (supplied by Ciba Japan (now part of BASF Japan Ltd.)), and CIT-1682 (supplied by Nippon Soda Co., Ltd.).

Exemplary cationic catalysts which generate cationic species through a heating treatment include aryl diazonium salts, aryl iodonium salts, aryl sulfonium salts, and allene-ion complexes, and preferred examples thereof include commercial products such as PP-33, CP-66, and CP-77 (each supplied by ADEKA Corporation); FC-509 (supplied by 3M Company); UVE1014 (supplied by General Electric Co., Ltd. (GE)); San-Aid SI-60L, San-Aid SI-80L, San-Aid SI-100L, and San-Aid SI-110L (each supplied by Sanshin Chemical Industry Co., Ltd.); and CG-24-61 (supplied by Ciba Japan (now part of BASF Japan Ltd.)). Such examples further include compounds between a chelate compound and a silanol (e.g., triphenylsilanol), which chelate compound is formed between a metal (e.g., aluminum or titanium) and acetoacetic acid or a diketone; and compounds between a chelate compound and a phenol (e.g., bisphenol-S), which chelate compound is formed between a metal (e.g., aluminum or titanium) and acetoacetic acid or a diketone.

The curing catalyst (D) is used in an amount of typically from about 0.01 to about 15 parts by weight, preferably from about 0.01 to about 12 parts by weight, more preferably from about 0.05 to about 10 parts by weight, and most preferably from about 0.1 to about 10 parts by weight, per 100 parts by weight of the total amount of epoxy-containing compounds contained in the curable epoxy resin composition. The curing catalyst (D), when used in an amount within this range, helps the composition to give a cured article excellent in thermal stability, light fastness, and optical transparency.

<Curing Accelerator (E)>

The curable epoxy resin composition according to the present invention may further include a curing accelerator (E). The curing accelerator (E) is a compound having the function of speeding up the curing rate when an epoxy-containing compound is cured by the action of a curing agent. The curing accelerator (E) is often used in combination with the curing agent (C). The curing accelerator (E) for use in the present invention can be any of known or customary curing accelerators, which are typified by 1,8-diazabicyclo[5.4.0]undecene-7 (DBU), and salts thereof such as phenol salt, octylic acid salt, p-toluenesulfonic acid salt, formic acid salt, and tetraphenylborate salt; 1,5-diazabicyclo[4.3.0]nonene-5 (DBN), and salts thereof such as phosphonium salt, sulfonium salt, quaternary ammonium salt, and iodonium salt; tertiary amines such as benzyldimethylamine, 2,4,6-tris(dimethylaminomethyl)phenol, and N,N-dimethylcyclohexylamine; imidazoles such as 2-ethyl-4-methylimidazole and 1-cyanoethyl-2-ethyl-4-methylimidazole; phosphoric esters, and phosphines such as triphenylphosphine; phosphonium compounds such as tetraphenylphosphonium tetra(p-tolyl)borate; organic metal salts such as tin octylate and zinc octylate; and metal chelates. Each of these may be used alone or in combination.

The curing accelerator (E) for use in the present invention can also be any of commercial products such as U-CAT SA 506, U-CAT SA 102, U-CAT 5003, U-CAT 18X, and 12XD (development article) (each supplied by SAN-APRO LIMITED); TPP-K and TPP-MK (each supplied by Hokko Chemical Industry Co., Ltd.); and PX-4ET (supplied by Nippon Chemical Industrial Co., Ltd.).

The curing accelerator (E) is used in an amount of typically from about 0.05 to about 5 parts by weight, preferably from about 0.1 to about 3 parts by weight, particularly preferably from about 0.2 to about 3 parts by weight, and most preferably from about 0.25 to about 2.5 parts by weight, per 100 parts by weight of the total amount of epoxy-containing compounds contained in the curable epoxy resin composition. The curing accelerator (E), if used in an amount of less than 0.05 parts by weight, may not exhibit sufficient curing acceleration effects; and, if used in an amount of more than 5 parts by weight, may cause the cured article to be colored and to have deteriorated hue.

<Rubber Particles>

The curable epoxy resin composition according to the present invention may further include rubber particles. Exemplary rubber particles include particulate NBR (acrylonitrile-butadiene rubber), reactive carboxy-terminal NBR (carboxy-terminal butadiene acrylonitrile; CTBN), metal-free NBR, and particulate SBR (styrene-butadiene rubber). The rubber particles herein may also be rubber particles which have a multilayer structure (core-shell structure) including a core having rubber elasticity (elastomeric core), and at least one shell layer covering the core, have a hydroxyl group and/or a carboxyl group in a surface layer thereof as a functional group capable of reacting with the alicyclic epoxy resin, and have an average particle diameter of from 10 nm to 500 nm and a maximum particle diameter of from 50 nm to 1000 nm, in which the difference in refractive index between the rubber particles and a cured article obtained from the curable epoxy resin composition falls within ±0.02. The amount of the rubber particles can be adjusted as appropriate according to necessity and is typically from about 0.5 to about 30 percent by weight and preferably from about 1 to about 20 percent by weight, relative to the total amount of the epoxy resin including the rubber particles dispersed therein. The rubber particles, if used in an amount of less than 0.5 percent by weight, may not provide sufficient cracking resistance. In contrast, the rubber particles, if used in an amount of more than 30 percent by weight, may adversely affect the thermal stability and optical transparency of the cured article.

<Additives>

The curable epoxy resin composition according to the present invention may employ additives of various kinds within ranges not adversely affecting the advantageous effects of the present invention, in addition to the above components. Typically, the use of one or more hydroxyl-containing compounds such as ethylene glycol, diethylene glycol, propylene glycol, and glycerol as additives allows the reaction to proceed gradually. In addition, the resin composition can contain any customary additives such as silicone- or fluorine-containing defoaming agents, leveling agents, silane coupling agents (e.g., γ-glycidoxypropyltrimethoxysilane), surfactants, inorganic fillers (e.g., silica and alumina), flame retardants, colorants, antioxidants, ultraviolet absorbers, ion adsorbents, pigments, phosphors, and releasing agents.

<Cured Article>

The curable epoxy resin composition according to the present invention may be cured at a temperature of from 45° C. to 200° C., preferably from 100° C. to 190° C., and more preferably from 100° C. to 180° C. for a curing time of from 30 to 600 minutes, preferably from 45 to 540 minutes, and more preferably from 60 to 480 minutes. The composition, if cured at a temperature for a time lower than or shorter than the above-specified ranges, may be cured insufficiently; whereas the composition, if cured at a temperature for a time higher than or longer than the above-specified ranges, may undergo decomposition of resin components, thus both being undesirable. While varying depending on various conditions, the curing conditions may be regulated as appropriate. Typically, when the curing temperature is high, the curing time may be controlled to be short; and when the curing temperature is low, the curing time may be controlled to be long. The curable epoxy resin composition according to the present invention, when cured, gives a cured article excellent in properties such as thermal stability, optical transparency, and cracking resistance.

<Optical-Semiconductor-Sealing Resin Composition>

An optical-semiconductor-sealing resin composition (resin composition for sealing an optical semiconductor) according to an embodiment of the present invention includes the curable epoxy resin composition according to the present invention. Sealing of an optical semiconductor element with the optical-semiconductor-sealing resin composition according to the present invention gives an optical semiconductor device excellent in properties such as thermal stability, optical transparency, and cracking resistance.

<Optical Semiconductor Device>

An optical semiconductor device according to an embodiment of the present invention is obtained by sealing an optical semiconductor element with the curable epoxy resin composition according to the present invention. The sealing of an optical semiconductor element may be performed by charging the curable epoxy resin composition (which has been prepared according to the aforementioned process) into a predetermined shaping die, and heating and curing the composition under predetermined conditions. This gives an optical semiconductor device including the optical semiconductor element sealed with the curable epoxy resin composition. The curing temperature and curing time herein may be set as mentioned above.

The curable epoxy resin composition according to the present invention is usable typically as or in optical semiconductor sealants, adhesives, electrical insulating materials, laminated plates, coatings, inks, paints (coating materials), sealants, resists, composite materials, transparent substrates, transparent sheets, transparent films, optical elements, optical lenses, optical members or materials, stereo lithography, electronic papers, touch panels, solar cell substrates, optical waveguides, light guide panels, and holographic memories.

EXAMPLES

The present invention will be illustrated in further detail with reference to several working examples below. It should be noted, however, that these examples are never construed to limit the scope of the present invention.

Preparation Example 1

Mixture of Curing Agent, Curing Accelerator, and Additive; Hereinafter Referred to as Agent C Agent C was obtained by uniformly mixing 100 parts by weight of a curing agent (Rikacid MH-700 supplied by New Japan Chemical Co., Ltd.), 0.5 part by weight of a curing accelerator (18X supplied by SAN-APRO LIMITED), and 1 part by weight of an additive (ethylene glycol supplied by Wako Pure Chemical Industries, Ltd.) using a rotary and revolutionary mixer ("AWATORIRENTARO (THINKY Mixer) AR-250", supplied by THINKY Corporation.

Preparation Example 2

Epoxy Resin

A series of epoxy resins (mixtures) was obtained by mixing a monoallyl diglycidyl isocyanurate (MA-DGIC supplied by SHIKOKU CHEMICALS CORPORATION) with an alicyclic epoxy compound (CELLOXIDE 2021P supplied by Daicel Corporation) or a bisphenol-A epoxy resin (YD-128 supplied by Tohto Kasei Co., Ltd.) in the formulations (unit: part by weight) given in Table 1, and stirring them at 80° C. for one hour to dissolve the monoallyl diglycidyl isocyanurate.

Examples 1 to 5 and Comparative Examples 1 to 3

A series of curable epoxy resin compositions was obtained by uniformly mixing each of the epoxy resins obtained in Preparation Example 2 with Agent C obtained in Preparation Example 1 in the formulations (unit: part by weight) given in Table 1 using a rotary and revolutionary mixer ("AWATOR-IRENTARO (THINKY Mixer) AR-250", supplied by THINKY Corporation) and degassing the resulting mixture. Each of the resin compositions was cast into a lead frame (InGaN element, 3.5 mm long and 2.8 mm wide) of an optical semiconductor as illustrated in FIG. 1, heated in an oven at 150° C. for 2 hours, and thereby yielded a series of optical semiconductor devices each including the element sealed with a cured resin. In FIG. 1, the reference signs 100 stands for a reflector (light-reflective resin composition), 101 stands for a metal wiring, 102 stands for a light-emitting diode (LED) element, 103 stands for a bonding wire, and 104 stands for a transparent sealing resin.

of each plate was measured at 450 nm using a spectrophotometer. The results are indicated in Table 1.

[Cracking Resistance Test]

Each of the optical semiconductor devices obtained in the examples and comparative examples was subjected to 400 cycles of thermal shock using a thermal shock tester. In one cycle of thermal shock, the optical semiconductor devices were exposed to −40° C. for 15 minutes and then exposed to 120° C. for 15 minutes. The optical semiconductor devices were observed on length of cracking using a digital microscope (VHX-900 supplied by Keyence Corporation). Of five specimens for each optical semiconductor device, the number of specimens each having one or more cracks with a length of 90 μm or more was counted. The results are indicated in Table 1.

[Overall Judgment]

Samples having a light transmittance of 85% or more in the optical transparency test, having a luminous intensity retention of 90% or more in the thermal stability test, and having a number of cracked specimen (cracked device) of zero in the cracking resistance test were evaluated as "Good" in overall judgment; whereas the other samples were evaluated as "Failure". The results are indicated in Table 1.

TABLE 1

|  |  | Example |  |  |  |  | Comparative Example |  |  |
|---|---|---|---|---|---|---|---|---|---|
|  |  | 1 | 2 | 3 | 4 | 5 | 1 | 2 | 3 |
| Epoxy resin | CEL2021P | 90 | 80 | 70 | 60 | 50 | 100 | 0 | 0 |
|  | MA-DGIC | 10 | 20 | 30 | 40 | 50 | 0 | 20 | 50 |
|  | YD-128 | 0 | 0 | 0 | 0 | 0 | 0 | 80 | 50 |
| Epoxy curing agent | Agent C | 140 | 140 | 140 | 140 | 140 | 140 | 105 | 115 |
| Cured article | Light transmittance (%) | 91 | 91 | 90 | 91 | 89 | 91 | 91 | 91 |
|  | Luminous intension retention (%) | 96 | 96 | 95 | 95 | 92 | 96 | 69 | 87 |
|  | Number of cracked devices (number) | 0 | 0 | 0 | 0 | 0 | 2 | 0 | 0 |
|  | Overall judgment | Good | Good | Good | Good | Good | Failure | Failure | Failure |

<Evaluations>

The curable epoxy resin compositions and optical semiconductor devices obtained in the examples and comparative examples were tested for evaluation according to the following methods.

[Thermal Stability Test]

Using a total luminous flux measuring instrument, the total luminous flux of each of the optical semiconductor devices obtained in the examples and comparative examples were measured. Next, a current of 40 mA was allowed to pass through the optical semiconductor devices in a thermostat at 60° C. for 300 hours, followed by measurement of the total luminous flux. The luminous intensity retention of each sample was calculated according to the following equation. The results are indicated in Table 1.

[Luminous intensity retention (%)]=[Total luminous flux (lm) 300 hours later]/[Total luminous flux (lm) at zero hour]×100

[Optical Transparency Test]

Each of the curable epoxy resin compositions before curing having the formulations in the examples and comparative examples was cast into a predetermined die, heated at 110° C. for 2 hours and at 150° C. for 3 hours in an oven, and thereby yielded a series of plates 3 mm thick. The light transmittance Components used in the examples and comparative examples are as follows:

Epoxy Resins

CEL2021P: 3,4-Epoxycyclohexylmethyl 3',4'-epoxycyclohexanecarboxylate, supplied by Daicel Corporation MA-DGIC: Monoallyl diglycidyl isocyanurate, supplied by SHIKOKU CHEMICALS CORPORATION YD-128: Bisphenol-A epoxy resin, supplied by Tohto Kasei Co., Ltd.

Agent C

Rikacid MH-700: 70:30 Mixture of 4-methylhexahydrophthalic anhydride and hexahydrophthalic anhydride, supplied by New Japan Chemical Co., Ltd.

18X: Curing accelerator, supplied by SAN-APRO LIMITED

Ethylene glycol: Product supplied by Wako Pure Chemical Industries, Ltd.

Testing Instruments

Resin Curing Oven

GPHH-201 supplied by ESPEC Corporation

Thermostat

Compact high-temperature chamber ST-120B1 supplied by ESPEC Corporation

Total Luminous Flux Measuring Instrument

Multi-channel spectroradiometer OL771 supplied by Optronic Laboratories, Inc. (now the Life Sciences & Instrumentation division of Gooch & Housego) U.S.A.
Spectrophotometer
Spectrophotometer UV-2450 supplied by Shimadzu Corporation
Thermal Shock Tester
Compact thermal shock chamber TSE-11-A supplied by ESPEC Corporation

INDUSTRIAL APPLICABILITY

The curable epoxy resin compositions according to the present invention excel in thermal stability, light fastness, optical transparency, and cracking resistance and are usable typically as or in optical semiconductor sealants, adhesives, electrical insulating materials, laminated plates, coatings, inks, paints (coating materials), sealants, resists, composite materials, transparent substrates, transparent sheets, transparent films, optical elements, optical lenses, optical members or materials, stereo lithography, electronic papers, touch panels, solar cell substrates, optical waveguides, light guide panels, and holographic memories.

REFERENCE SIGNS LIST

100: reflector (light-reflective resin composition)
101: metal wiring
102: LED element
103: bonding wire
104: transparent sealing resin

The invention claimed is:

1. A curable epoxy resin composition comprising an alicyclic epoxy compound (A); a monoallyl diglycidyl isocyanurate compound (B) represented by following Formula (1):

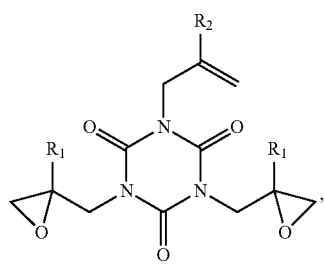

(1)

wherein each of $R_1$s and $R_2$ independently represents a hydrogen atom or an alkyl group having 1 to 8 carbon atoms; and
one of a curing agent (C) and a curing catalyst (D); and wherein
the alicyclic epoxy compound (A) is in the amount of from 60 to 90 parts by weight per 100 parts by weight of the total amount of the alicyclic epoxy compound (A) and the monoallyl diglycidyl isocyanurate compound (B).

2. The curable epoxy resin composition according to claim 1, wherein the alicyclic epoxy compound (A) has cyclohexene oxide group as an alicyclic epoxy group thereof.

3. The curable epoxy resin composition according to claim 2, wherein the alicyclic epoxy compound (A) is a compound represented by following Formula (I-1):

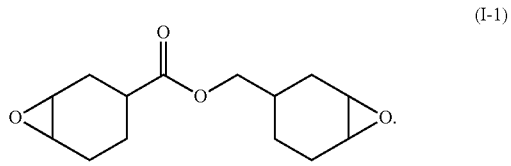 [SMILES: O=C(OCC1CCC2OC2C1)C1CCC2OC2C1]

(I-1)

4. The curable epoxy resin composition according to claim 1, further comprising a curing accelerator (E).

5. A cured article obtained through curing of the curable epoxy resin composition of claim 1.

6. An optical-semiconductor-sealing resin composition comprising the curable epoxy resin composition of claim 1.

7. An optical semiconductor device comprising an optical semiconductor element sealed with the curable epoxy resin composition of claim 1.

8. The curable epoxy resin composition according to claim 2, further comprising a curing accelerator (E).

9. The curable epoxy resin composition according to claim 3, further comprising a curing accelerator (E).

10. A cured article obtained through curing of the curable epoxy resin composition of claim 2.

11. A cured article obtained through curing of the curable epoxy resin composition of claim 3.

12. A cured article obtained through curing of the curable epoxy resin composition of claim 4.

13. An optical-semiconductor-sealing resin composition comprising the curable epoxy resin composition of claim 2.

14. An optical-semiconductor-sealing resin composition comprising the curable epoxy resin composition of claim 3.

15. An optical-semiconductor-sealing resin composition comprising the curable epoxy resin composition of claim 4.

16. An optical semiconductor device comprising an optical semiconductor element sealed with the curable epoxy resin composition of claim 2.

17. An optical semiconductor device comprising an optical semiconductor element sealed with the curable epoxy resin composition of claim 3.

18. An optical semiconductor device comprising an optical semiconductor element sealed with the curable epoxy resin composition of claim 4.

* * * * *